United States Patent [19]

Nasu et al.

[11] Patent Number: 5,636,092
[45] Date of Patent: Jun. 3, 1997

[54] MAGNETIC HEAD HAVING CHROMIUM NITRIDE PROTECTIVE FILM FOR USE IN MAGNETIC RECORDING AND/OR REPRODUCING APPARATUS AND METHOD OF MANUFACTURING THE SAME

[75] Inventors: Shogo Nasu, Kobe; Hiroshi Ryonai, Osaka, both of Japan

[73] Assignee: Matsushita Electric Industrial Co., Ltd., Osaka, Japan

[21] Appl. No.: 323,619

[22] Filed: Oct. 17, 1994

Related U.S. Application Data

[63] Continuation-in-part of Ser. No. 98,836, Jul. 29, 1993, Pat. No. 5,475,552.

[30] Foreign Application Priority Data

| Jul. 31, 1992 | [JP] | Japan | 4-204816 |
| Nov. 6, 1992 | [JP] | Japan | 4-296851 |
| Oct. 19, 1993 | [JP] | Japan | 5-260758 |
| Oct. 14, 1994 | [JP] | Japan | 6-249655 |

[51] Int. Cl.⁶ .............................. G11B 5/187
[52] U.S. Cl. .................................. 360/122
[58] Field of Search .................. 360/122, 125, 360/126

[56] References Cited

U.S. PATENT DOCUMENTS

| 4,660,114 | 4/1987 | Yamakawa et al. | 360/122 |
| 4,761,334 | 8/1988 | Sagoi | 428/332 |
| 4,918,555 | 4/1990 | Yoshizawa et al. | 360/126 |
| 4,983,465 | 1/1991 | Shimizu et al. | 360/126 |
| 5,287,239 | 2/1994 | Iwasaki | 360/126 |
| 5,369,539 | 11/1994 | Shimizu | 360/126 |

FOREIGN PATENT DOCUMENTS

| 0 123 826 | 11/1984 | European Pat. Off. |
| 0 528 459 | 2/1993 | European Pat. Off. |
| 55-12652 | 4/1980 | Japan. |
| 56-1682 | 1/1981 | Japan. |
| 61-211807 | 9/1986 | Japan. |
| 62-31010 | 2/1987 | Japan. |
| 63-58613 | 3/1988 | Japan | 360/122 |
| 2-44508 | 2/1990 | Japan | 360/122 |
| 3100908 | 4/1991 | Japan | 360/122 |
| 3-267363 | 11/1991 | Japan. |
| 4-6656 | 1/1992 | Japan | 360/122 |
| 5-54321 | 3/1993 | Japan. |
| 5114112 | 5/1993 | Japan | 360/122 |
| 85/02289 | 5/1985 | WIPO. |

OTHER PUBLICATIONS

Patent Abstracts of Japan, vol. 11, No. 163 (C424), Mar. 26, 1987.

Database WPI, Section CH, Week 9226, Derwent Publications Ltd., London GB Class M13, AN 92-212965.

(List continued on next page.)

*Primary Examiner*—Stuart S. Levy
*Assistant Examiner*—Allen Cao
*Attorney, Agent, or Firm*—Wenderoth, Lind & Ponack

[57] ABSTRACT

A magnetic head is provided with a protective film of chromium nitride on its sliding surface. The film thickness is set to have no adverse effect upon the electromagnetic conversion characteristics of the head, and the film has sufficient wear resistance not only against a magnetic tape having its sliding surface formed of iron oxide or other metallic magnetic substances, but also against a magnetic tape having its sliding surface formed of chrome oxide, the chrome oxide substance having a strong abrasion effect upon the magnetic head. The protective film has a compressive internal stress in a range of $10^9$ to $10^{11}$ dynes/cm², a Knoop hardness of not less than 1500 kgf/mm², a nitrogen composition ratio in a range of 20 to 60 atom %. The magnetic head core portion (23, 60) or non-magnetosensitive portion (25; 26, 61) has a plurality of minute projections (62) formed on the top surface thereof. The height of each projection is approximately equal to the size of each crystalline particle in diameter of the core portion or the non-magnetosensitive portion, where the maximum surface roughness is made greater than 150 Å.

8 Claims, 6 Drawing Sheets

OTHER PUBLICATIONS

Database WPI, Section CH, Week 9314, Derwent Publications Ltd., London GB Class A12, AN 93-113709.

Morrison et al., "Magnetic Transducer Head", IBM Technical Disclosure Bulletin, vol. 7, No. 4, Sep. 1964.

Patent Abstracts of Japan, vol. 13, No. 302 (C-616) Jul. 12, 1989.

Patent Abstracts of Japan, vol. 15, No. 167 (C-0827) Apr. 26, 1991.

Patent Abstracts of Japan, vol. 14, No. 074 (C-0687) Feb. 13, 1990.

Database WPI, Section Ch, Week 8627, Derwent Publications Ltd., London GB; Class M13, AN 86-173489.

Patent Abstracts of Japan, vol. 13, No., 420 (M-872) Sep. 19, 1989.

Database WPI, Section Ch, Week 8230, Derwent Publications Ltd., London, GB; Class M13, AN 82-61665E.

MAGNETIC HEAD HAVING CHROMIUM NITRIDE PROTECTIVE FILM FOR USE IN MAGNETIC RECORDING AND/OR REPRODUCING APPARATUS AND METHOD OF MANUFACTURING THE SAME

This is a continuation-in-part application in connection with the U.S. patent application Ser. No. 08/098,836 filed on Jul. 29, 1993, Pat. No. 5,475,552.

BACKGROUND OF THE INVENTION

1. Field of the Invention

The present invention relates to a magnetic head for use in a tape recorder such as an audio tape recorder, video tape recorder and digital audio tape recorder, and other magnetic recording and reproducing apparatus for a hard disk, floppy disk, magnetic card and the like, and to a method of manufacturing the same.

2. Description of the Prior Art

In a general magnetic recording and reproducing apparatus, a magnetic head is used for recording, reproducing, and erasing data by sliding a magnetic recording medium such as a magnetic tape or magnetic disk on a top surface of the magnetic head. In such a case, a magnetic head is involved with a problem in that the sliding movement of the head in contact with a recording medium inevitably causes frictional wear of the top surface of the head, which eventually leads to the deterioration of electromagnetic conversion characteristics in the magnetic head performance.

In attempts to eliminate such a problem, there have been made various proposals. For example, in the Japanese Patent Publication No. 56-1682 (published in 1981), there is disclosed a method where a boron imparting material is applied to the sliding surface of the magnetic head, which is then subjected to an annealing process to form a boron diffused layer thereon to substantially harden the sliding surface of the head with an improvement in wear resistance.

Another method has been proposed in the Japanese Patent Publication No. 55-12652 (published in 1980) where metal hardening atoms are implanted by ion implantation into the sliding surface of the magnetic head to harden the sliding surface, whereby improvement in wear resistance is achieved.

Further, there has been proposed still another method where improvement in wear resistance of the magnetic head is achieved by coating a thin film having a high degree of hardness on the sliding surface of the magnetic head. For example, in the Japanese Patent Unexamined Laid-Open 267363/1991, disclosed is a method in which a thin film of boron nitride is provided on a surface of an intermediate thin layer which is formed on the sliding surface of the magnetic head. The intermediate thin layer contains at least one kind of element of group IIIb, group IVa and group IVb elements.

However, these methods involve the following problems. That is, in the method which comprises a process of thermal diffusion of a boron material, as well as in the method which comprises a process of ion implantation, the control operation of the process must be strictly effected for adjusting the temperature, cooling velocity, and the like, which results in higher production cost. Further, the use of a high temperature treatment and the impact of ions may adversely affect the interior of the magnetic head.

With the method which comprises a process of forming a thin film of boron nitride, there is a problem involved in that a two-layer structure is required. That is, the boron nitride film is formed on an intermediate thin layer, which naturally results in lower productivity. Another problem is that, for the purpose of an improvement in wear resistance, the thin film coating is often made thicker than 0.1 µm in its total thickness so that the thin film of the head defines a spacing between the head and a recording medium. Hence, the spacing virtually causes a loss due to uneven wear of the sliding surface, deteriorating the electromagnetic conversion characteristics of the head. Even a degree of film thickness of more than 0.1 µm is not sufficient to achieve a good wear resistance.

Accordingly, the present inventor attempted to form a protective film made of chromium nitride on a sliding surface of a magnetic head by a method using a reactive high-frequency magnetron sputtering technique. Then the inventor discovered the fact that this approach could provide a film coating having no adverse influence on the electromagnetic conversion characteristics of the head with its thickness less than 0.1 µm, which still has excellent wear resistance. In the tests of driving the magnetic head with a magnetic tape having its magnetic layer composed of an iron oxide magnetic substance, the protective film coated on the sliding surface of the magnetic head exhibited an excellent wear resistance, having an endurance in driving for more than 1000 hours.

However, in the driving tests using a magnetic tape having its magnetic layer containing a chrome oxide magnetic substance, since the chrome oxide has a high abrasive force against the magnetic head, there occurred many spot-like peelings of the protective film of chromium nitride on the sliding surface of the head in driving for 100 hours, and the area of the peeling portion was increased with time lapse of the driving to an extent that the protective film of chromium nitride was peeled off over an area of about one half of the sliding surface area of the head in a time period of 500 hours.

Further, there has not yet been known in the art any protective coating film for magnetic heads which can exhibit excellent wear resistance as well stand a driving test for more than 1000 hours against a magnetic tape having its magnetic layer composed of a chrome oxide magnetic substance.

SUMMARY OF THE INVENTION

Therefore, it is an essential objective of the present invention to provide a magnetic head having a protective thin film formed on a sliding surface where the thickness of the protective thin film is made thin in a range exerting no adverse effect on the electromagnetic conversion characteristics of the magnetic head, and improving the magnetic head in wear resistance against a magnetic tape having its magnetic layer composed of a chrome oxide magnetic substance which has a strong abrasion effect upon the magnetic head.

Another objective of the present invention is to provide a method of manufacturing the same magnetic head as mentioned above.

In order to achieve the objective mentioned above, a magnetic head for recording and/or reproducing data to and/or from a magnetic recording medium to be slid in contact with a surface of the magnetic head comprises a non-magnetosensitive portion serving as a substrate and cover member, a magnetosensitive portion serving as a substrate and cover member, a magnetosensitive portion serving as a core body, and a protective thin film which is formed on a sliding surface of the magnetic head, covering the top surface of at least one of the non-magnetosensitive portion and magnetosensitive portion. The protective thin film is to be slid along with a sliding surface of the magnetic recording medium at least one of the non-magnetosensitive portion and magnetosensitive portion is formed with a plurality of minute projections as surface irregularities that the maximum surface roughness given by a maximum value of each projection height is of greater than 150 Å in size.

According to one aspect of the invention, there is provided a magnetic head comprising a protective thin film of a chromium nitride substance formed on a sliding surface of the magnetic head which is slidable along with a surface of a magnetic recording medium. The chromium nitride thin film formed on the sliding surface of the magnetic head has a compressive internal stress in a range of $10^9$ to $10^{11}$ dynes/cm$^2$, a Knoop hardness of not less than 1500 kgf/mm$^2$, a nitrogen composition ratio of 20 to 60 atom %, and a thickness in a range of 50 to 1000 Å.

The magnetic head in accordance with the present invention has a protective thin film of chromium nitride substance formed on the sliding surface of the head, the chromium nitride protective film meeting the following conditions: the protective film has a compressive internal stress of $10^9$ to $10^{11}$ dynes/cm$^2$; and its Knoop hardness is not less than 1500 kgf/mm$^2$, with its nitrogen composition ratio 20 to 60 atom %. The magnetic head can exhibit excellent wear resistance not only against a magnetic tape having its magnetic layer composed of an iron oxide magnetic substance and other metallic magnetic materials, but also against a magnetic tape having its magnetic layer composed of a chrome oxide magnetic substance, which has a strong abrasion effect upon the head.

The thickness of the protective film is made thin, within the range of 50 to 1000 Å, in which range there is caused no spacing loss on the relation between the magnetic head and the magnetic recording medium. Therefore, it is possible to provide a magnetic head highly resistant to frictional wear by providing a protective film with its thickness made thin in a range exerting no spacing effect between the magnetic head and the magnetic recording medium.

Furthermore, in the process of forming the protective chromium nitride film, the temperature of the substrate of the magnetic head for film formation is kept at room temperature, thereby preventing thermal deterioration of the magnetic head.

BRIEF DESCRIPTION OF THE DRAWINGS

The above and other objects and features of the present invention will become apparent from the following description, taken in conjunction with a preferred embodiment thereof and with reference to the accompanying drawings, in which.

DETAILED DESCRIPTION OF THE PREFERRED EMBODIMENTS

One embodiment of the present invention will now be described in detail with reference to the attached drawings.

For fabrication of a chromium nitride protective film, employed is a method according to a physical vapor deposition technique. In this embodiment, a reactive high-frequency magnetron sputtering technique was employed for providing a chromium nitride film for protection.

Figure 1:
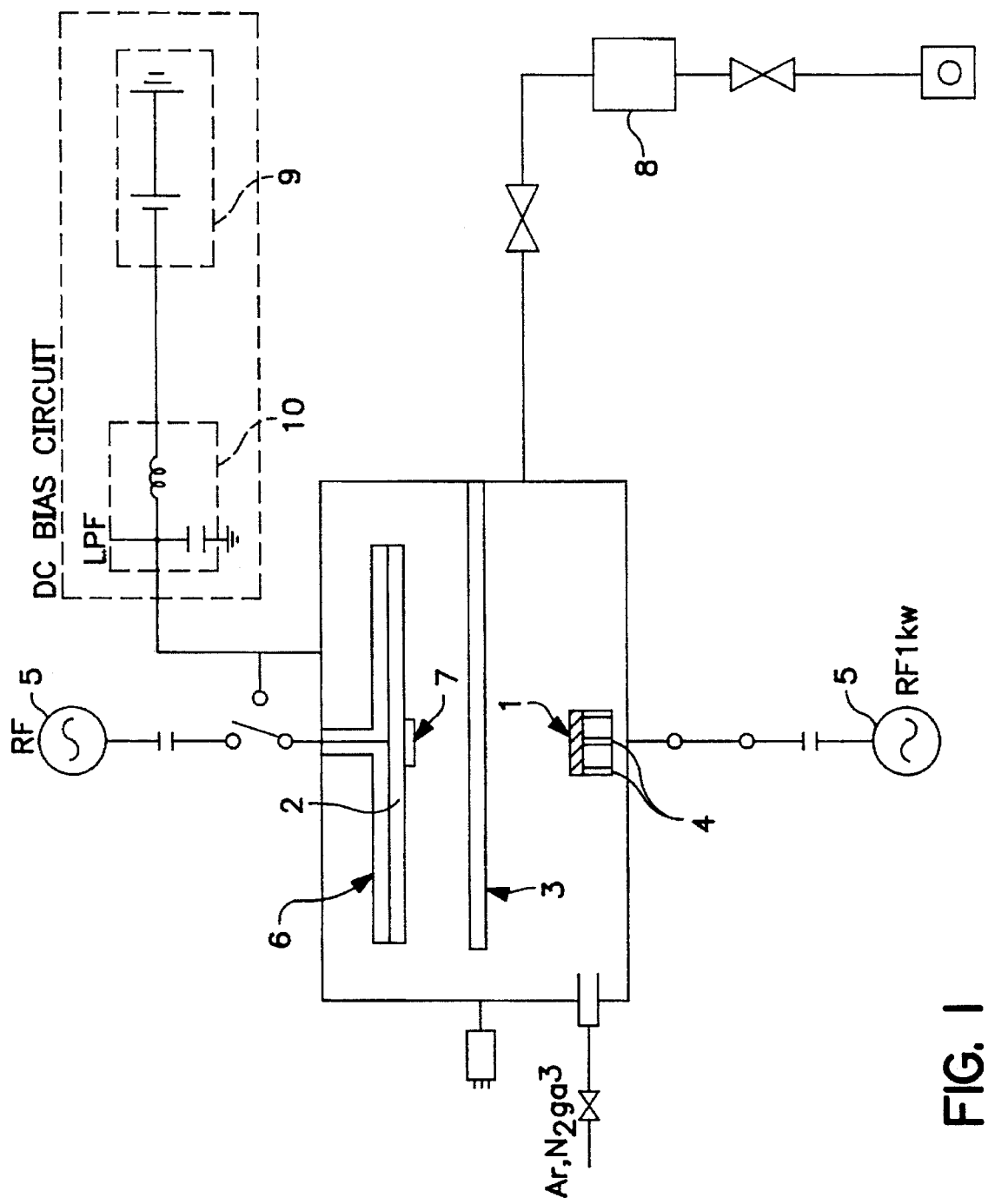
FIG. 1 is a schematic view of a reactive high-frequency magnetron sputtering technique employed in an embodiment of the present invention.

FIG. 1 shows a schematic view of a reactive high-frequency magnetron sputtering technique, where a protective thin film of chromium nitride was formed by effecting a high-frequency electric discharge in a mixture gas of argon and nitrogen using a chrome target 1 of 6 inches in diameter. The chrome target 1, disposed on a magneto mechanism 4, is sputtered by high-frequency electric discharge from a RF power source 5 in the mixture gas of argon and nitrogen to be coated onto a substrate 2 through a shutter 3. The substrate 2, having a head chip attachment member 7, is held by a holder 6.

The chromium nitride film was formed under the conditions that: the substrate for forming the film thereon was water-cooled (water-cooling means is not shown); electric power of 400 W was used for sputtering; and mixture gas pressure for the sputtering was kept constant at 8 milli Torr by means of a cryopump 8. The temperature of the substrate 2 for the head was kept at room temperature in a range of not more than 40° C. while the holder 6 for holding the substrate was also water-cooled. In this process, the temperature of the substrate was measured by means of a sheet shaped temperature sensor such as "Heat-Label" made by Micron Co., Ltd. (not shown).

A negative DC bias voltage supplied from a DC power source 9 in a DC bias circuit was applied to the substrate 2 through a low-pass filter 10 during the film forming process for improving the crystallinity and adhesion of the chromium nitride film. The nitrogen composition ratio of the protective chromium nitride film was controlled by varying the argon to nitrogen ratio of the sputtering gas mixture. The nitrogen content of the film was analyzed according to the Auger electron spectroscopic method.

In this preferred embodiment, the internal stress of the chromium nitride film was controlled by controlling the nitrogen composition ratio, DC bias voltage or total sputtering gas pressure. The internal stress was measured on the basis of the warp amount of a disk-shaped silicon substrate on which the chromium nitride film was deposited using a known stress measurement device. Knoop hardness measurement was carried out by using a microhardness tester commercialized as MVK-1 (made by Akashi Seisakusho Co., Ltd.). The thickness of the chromium nitride film is controlled by controlling the deposition time of the film, where the deposition speed of the chromium nitride film was kept constant at approximately 6.3 Å per second.

In view of the observation made by the inventor that, when a magnetic tape has its magnetic layer composed of a chrome oxide material, the abrasive force of the magnetic tape to the magnetic head is largely attributable to the hardness of chrome oxide particles per se, the present inventor closely examined the hardness of a chromium nitride film serving as a protective thin film of the magnetic head. As a result of the examination, it was found that there is an intimate relationship between the hardness of the chromium nitride film and the compressive internal stress of the chromium nitride film where the chromium nitride film is formed on the substrate held at a room temperature. The compressive internal stress of the chromium nitride film can be controlled by varying the total sputtering gas pressure, the negative DC bias voltage applied to the substrate and the like.

Figure 2:
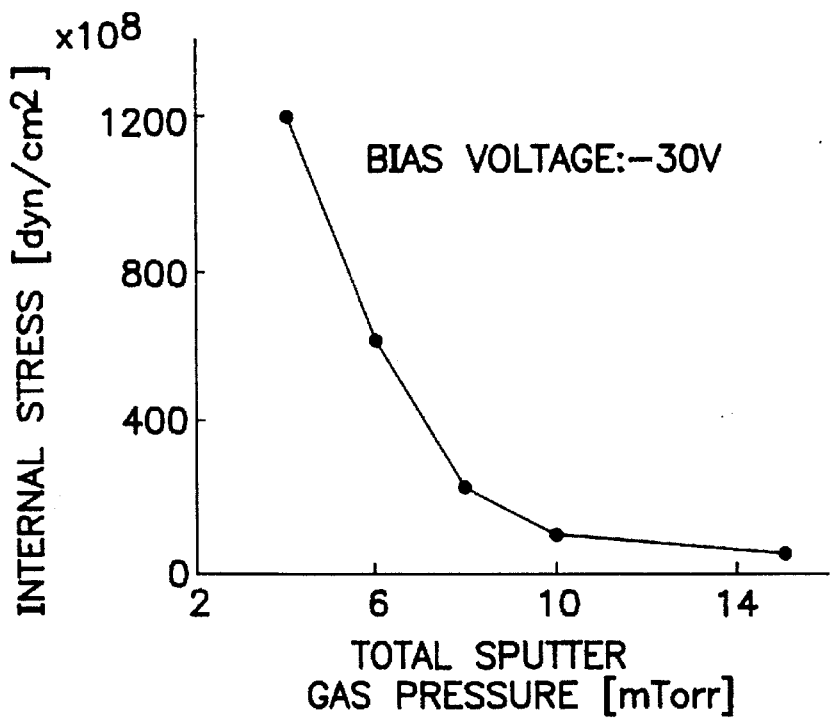
FIG. 2 is a graph showing a relationship between a total sputtering gas pressure and a compressive internal stress of a chromium nitride film in the embodiment.

FIG. 2 shows a relationship between the total sputtering gas pressure and the compressive internal stress of the chromium nitride film under the condition that the nitrogen/argon gas ratio is 1:1 and the DC bias voltage is kept constant at −30 V. It can be understood from the figure that the lower the sputtering gas pressure, the greater the internal stress.

Figure 3:
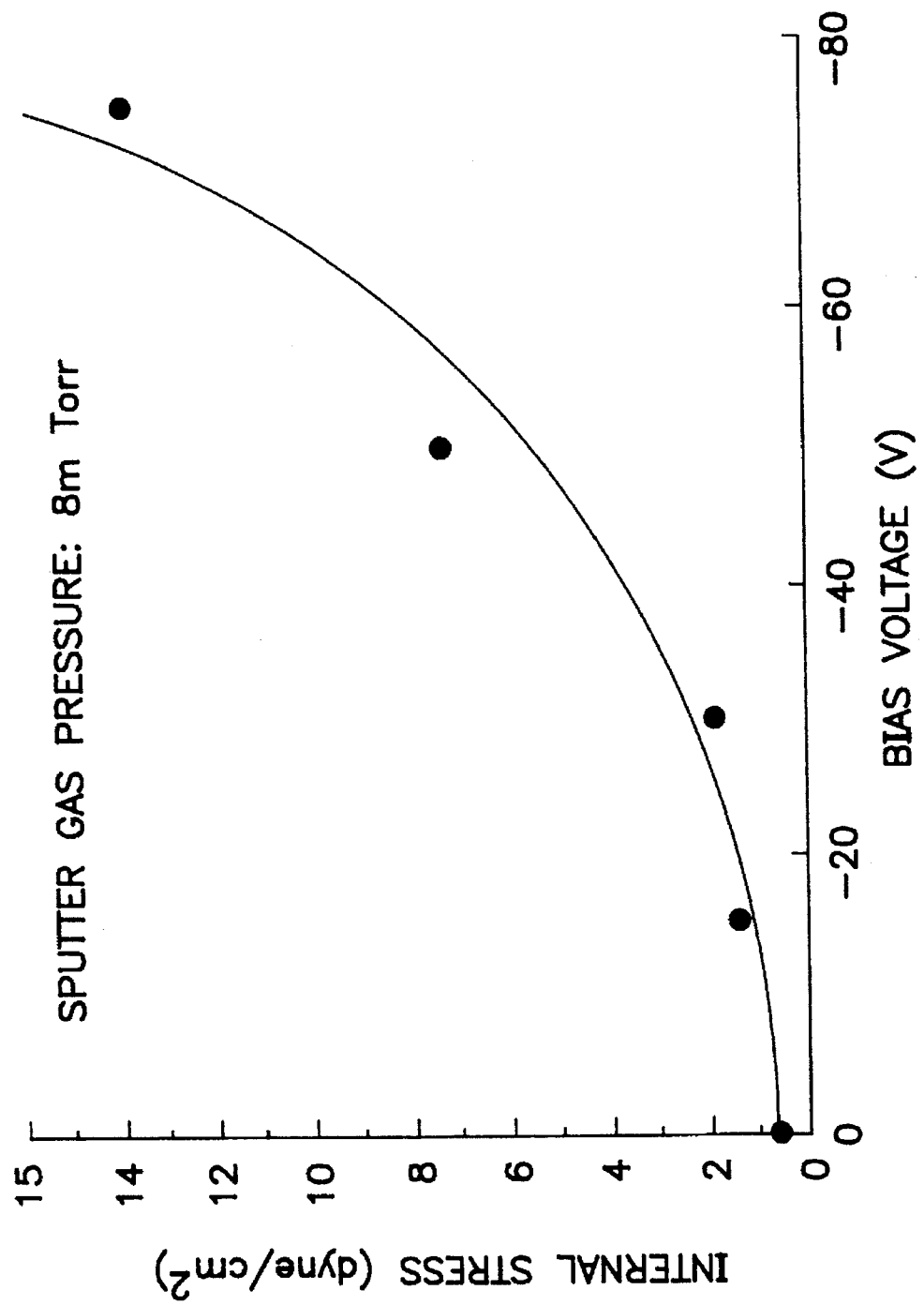
FIG. 3 is a graph showing a relationship between a negative DC bias voltage and compressive internal stress of a chromium nitride film according to the present invention.

FIG. 3 shows a relationship between the negative DC bias voltage applied to the substrate and the compressive internal stress of the chromium nitride film under the condition that the total sputtering gas pressure is kept constant at 8 milli Torr with the nitrogen/argon gas ratio of 1:1. It can be understood from the figure that the greater the negative DC bias voltage, the greater the internal stress. Even where the negative DC bias voltage was increased, the internal stress grew larger. Therefore, the control of the internal stress was effected by varying the sputtering gas pressure and/or the negative DC bias voltage.

Figure 4:
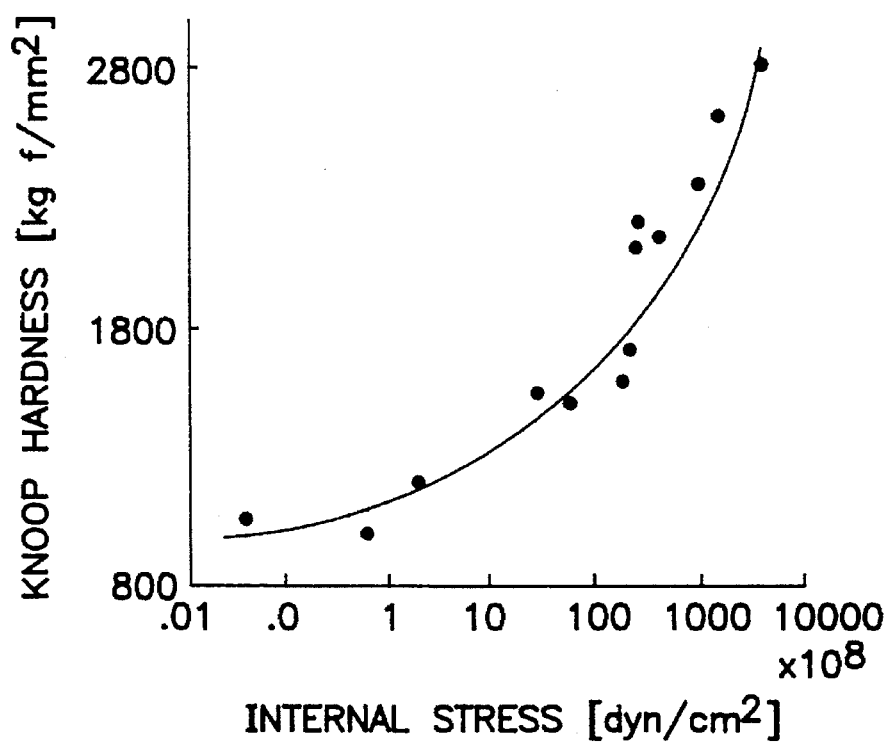
FIG. 4 is a graph showing a relationship between compressive internal stress and Knoop hardness with respect to a chromium nitride film in the embodiment of the invention.

FIG. 4 shows a relationship between compressive internal stress values and Knoop hardness values of a chromium nitride film, where the internal stress is varied by controlling the negative DC bias voltage as shown in FIG. 3. In this example, the nitrogen composition ratio of the chromium nitride film was set in a range of 40 to 50 atom %. It can be seen from FIG. 4 that there is a correlation between the internal stress and the Knoop hardness such that the Knoop hardness value becomes greater as the compressive internal stress value increases. When the internal stress is not less than $10^9$ dynes/cm$^2$, the Knoop hardness is not less than 1500 kgf/mm$^2$ but not more than 2800 kgf/mm$^2$. When the internal stress is greater than $10^{11}$ dynes/cm$^2$, there occurs cracking and film peeling over the entire surface of the chromium nitride film, rendering the chromium nitride film useless for purposes of protecting the magnetic head.

In order to evaluate the wear resistance of the chromium nitride film mentioned above, magnetic heads coated with chromium nitride films were subjected to abrasion resistance testing.

Figure 5A:
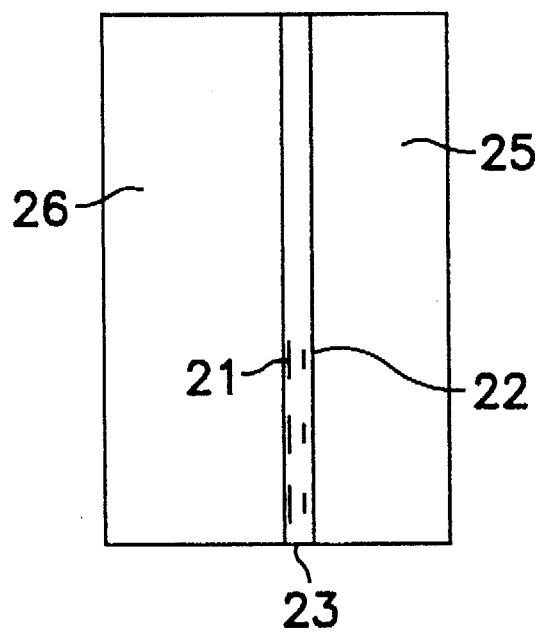
FIGS. 5A and 5B are top and side plan views of one example of a magnetic head according to the present invention.
Figure 5B:
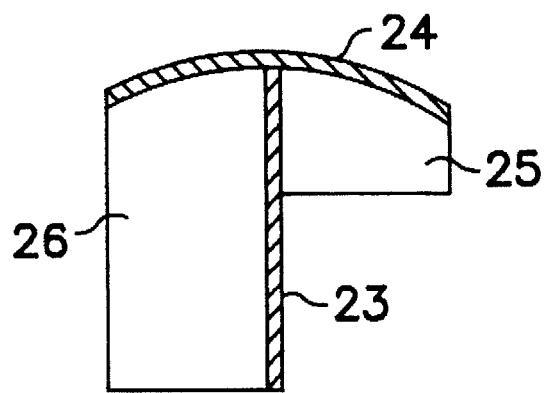

FIGS. 5($a$) and 5($b$) show an example of a structure of a magnetic head, where a substrate 26 is conjoined with a cover member 25 by way of a core body 23 of a magnetic sensitive substance interposed between the substrate 26 and the cover member 25. In this embodiment, an AlTiC material was used for both the substrate 26 and the cover member 25. The core body 23 is made of a magnetic thin film, which is formed with recording tracks 21 and reproducing tracks 22. A protective thin film 24 is formed on the sliding surface of the magnetic head, covering the top portions of the substrate 26, cover member 25 and core body 23.

It is to be noted here that the structure of the magnetic head is not limited to this, and modifications thereof can be made using the improvement of the protective thin film of chromium nitride.

The core body 23 may be made of a NiZn ferrite material other than the AlTiC material. Also, the cover member 25 may be made of a barium titanate material other than the AlTiC material. In this embodiment, the thickness of the chromium nitride film was kept constant at 500 Å in all of the test samples. Each magnetic head was incorporated into a cassette deck mechanism, and the wear resistance evaluation test was effected under a pad pressure of 20 g, using a magnetic tape having its magnetic layer formed of a chrome oxide substance. Each magnetic head used in the test for the wear resistance evaluation was of an AlTiC/AlTiC type using AlTiC for both the substrate and the cover members. Tape drive tests were carried out under ordinary temperature and ordinary humidity conditions for 1000 hours in such a manner that each magnetic tape was replaced with a new magnetic tape at 100 hour intervals.

Table 1 shows the results of the tests for the wear resistance evaluation in the embodiment according to the present invention.

In Table 1, exemplified Examples 1 through 3 represent the cases in which the negative DC bias voltage was varied to increase the internal stress of the chromium nitride film at a constant sputter gas pressure of 8.0 m Torr. In the exemplified Examples 1 through 3, the Knoop hardness values were 1510 kgf/mm$^2$, 2100 kgf/mm$^2$ and 2330 kgf/mm$^2$ under application of the negative DC bias voltages of 0 V, −30 V, and −50 V respectively.

Exemplified Examples 4 through 6 represent the cases in which the internal stress was varied by setting the DC bias voltage −50 V, −75 V, and 0 V at a constant sputter gas pressure of 4.0 m Torr. The Knoop hardness values were 2610 kgf/mm$^2$, 2800 kgf/mm$^2$, and 1750 kgf/mm$^2$, with the internal stress values of $12.6 \times 10^{10}$ dynes/cm$^2$, $32.5 \times 10^{10}$ dynes/cm$^2$ and $4.0 \times 10^{10}$ dynes/cm$^2$ respectively. Referring to Examples 3 and 4, the total sputter gas pressure was varied from 8.0 to 4.0 m Torr to increase the internal stress at a constant DC bias voltage of −50 V. In any of Examples 1 through 6, the Knoop hardness value was as high as more than 1500 kgf/mm$^2$ and excellent wear resistance was obtained such that there occurred little or almost no peel-off wear of chromium nitride film from the substrate even after 1000 hours of sliding operation of the magnetic head in contact with the magnetic tape having its magnetic layer formed of highly abrasive chrome oxide film. As shown in Example 6, by decreasing the sputter gas pressure, some degree of Knoop hardness is obtained without application of the DC bias voltage.

In contrast, as shown in Reference Examples 1 to 3 for comparison, in the case where the internal stress of the chromium nitride film was smaller than $1 \times 10^9$ dynes/cm$^2$ and the Knoop hardness was less than 1500 kgf/mm$^2$, scratch marks were produced in large numbers on the surface of the film after sliding the magnetic head in contact with the magnetic tape for 1000 hours, and the head thus suffered considerable peel-off wear.

Also, as can be seen in the case of Reference Examples 4 and 5 for comparison when larger DC bias voltages of −100 V and smaller sputter gas pressures of 8.0 and 4.0 m Torr were used to thereby increase the internal stress above $10^{11}$ dyn/cm$^2$, the Knoop hardness was inversely lowered and cracks occurred immediately after the process of coating the film. This indicates that the internal stress becomes excessively large so that releasing of stress is started. Such chromium nitride films are not suitable for use as protective films of a magnetic head. It may be appreciated from the above discussion that a chromium nitride film having a compressive internal stress in a range from $1\times10^9$ to $1\times10^{11}$ dynes/cm$^2$ with a Knoop hardness of not less than 1500 kgf/mm$^2$ can provide excellent wear resistance of a protective film for the magnetic head.

Table 2 shows the results of wear resistance tests of chromium nitride films according to the embodiment of the invention, where the nitrogen composition ratio of the chromium nitride film was varied to control the internal stress of the chromium nitride film.

Exemplified Examples 7 to 10 are the cases where the nitrogen composition of the chromium nitride film was varied within the range from 20 to 60 atom %, with a DC bias voltage kept constant at −30 V. No or little, if any, peel-off wear was found in any of these Examples 7 through 10 after 1000 hours of sliding movement of the magnetic head over a magnetic tape.

Reference Examples 6 and 7, for comparison, are the cases where the DC bias voltage applied to the substrate was almost the same as that in the exemplified Examples 7 to 9, but the nitrogen composition was less than 20 atom %. Also, Reference Examples 8 and 9, for comparison, are the cases where the DC bias voltage was almost the same as that in exemplified Examples 7 to 9, but the nitrogen composition was greater than 60 atom %. In any of the reference Examples 6 to 9, for comparison, peel-off wear was found noticeable.

This is because when the nitrogen composition is less than 20 atom %, metal chrome characteristics are pronounced. Presumably, therefore, even if the compressive internal stress is high, the Knoop hardness is reduced, resulting in decreased wear resistance. On the other hand, when the nitrogen composition is greater than 60 atom %, there is a considerable change in the structure of the chromium nitride film and presumably, therefore, both the internal stress and the Knoop hardness are substantially reduced, which results in decreased wear resistance.

On the basis of these observations, in order to achieve good frictional wear resistance, the nitrogen composition of a chromium nitride film should preferably be within the range of 20 to 60 atom %.

In order to attain excellent wear resistance, surface roughness of the head sliding surface is also an important condition, besides the aforementioned conditions of the nitrided chrome film. The inventor has found that giving a proper surface roughness to a sliding surface further improves the wear resistance.

In this preferred embodiment, a magnetic head to be slid in contact with a surface of a magnetic head includes a non-magnetosensitive portion serving as a substrate and cover member and a magnetosensitive portion serving as a core body. A protective thin film (24) may be formed on a top surface of the magnetic head, covering the top surface of at least any one of the non-magnetosensitive portion and magnetosensitive portion, which the protective thin film is to be slid along with on a sliding surface of the magnetic recording medium. At least one of the non-magnetosensitive portion and magnetosensitive portion is formed with a plurality of minute projections for forming surface irregularities, wherein the maximum surface roughness, given by a maximum value of each projection height, is set to greater than 150 Å in size.

Alternatively, in this embodiment, the core body portion may be formed with a plurality of minute projections each having its height approximately corresponding to the crystalline particle size of a material of the core body for the surface irregularities.

Figure 6A:
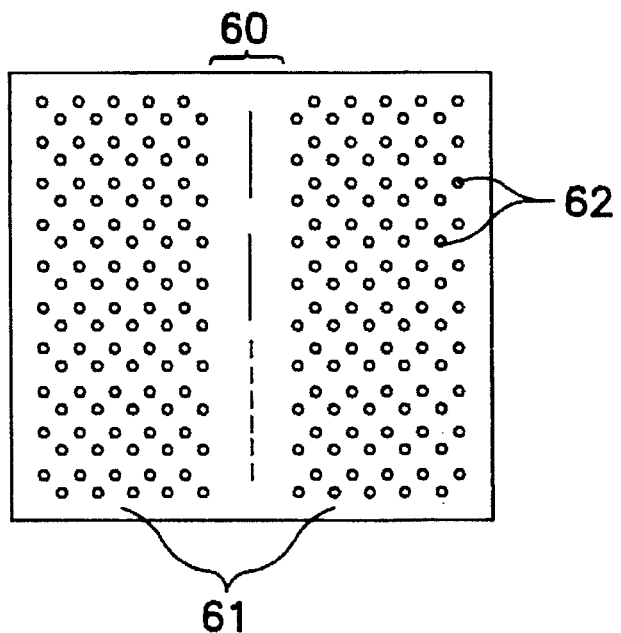
FIGS. 6A and 6B are schematic views showing a head sliding surface of a magnetic head having projections formed thereon.
Figure 6B:
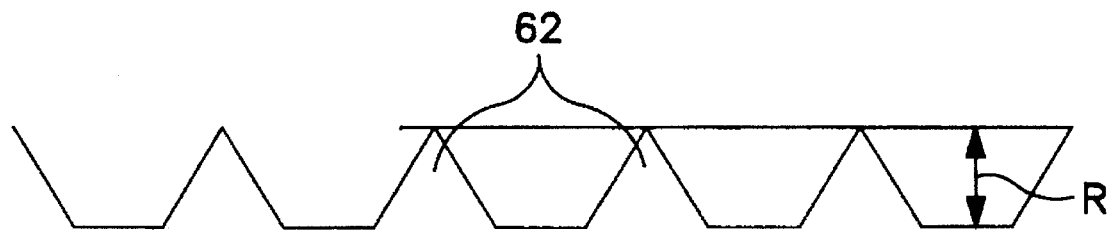

Further, in a preferred embodiment, the non-magnetosensitive portion is formed with a plurality of minute projections (62 as shown in FIGS. 6A and 6B) each having its height approximately corresponding to the crystalline particle size of a material of the non-magnetosensitive portion for the surface irregularities.

The surface roughness of the head sliding surface was obtained by using a sputtering system in one embodiment and using an ion milling system in another embodiment. In the case of the sputtering technique, the electrodes of an anode and cathode were switched over so that a member on the substrate side having a magnetic head held thereon would be sputtered. Then sputter gas was introduced and plasma was generated with a 200 W sputtering power, whereby the head sliding surface was subjected to sputtering. The sputtering process as carried out in the conditions of a nitrogen amount ($N_2/Ar+N_2$) being of 0.5 and a total sputter gas pressure being of constant 8 mTorr constant. Immediately thereafter, with the electrodes switched over, nitrided chrome coating was performed. Thereafter, the roughness of the surface was measured, The fabrication conditions of the nitrided chrome coating were the same as in the sputtering process, with the DC bias voltage being constant at −33 V. The processing gas may optionally be selected as one type of gas or any combination of two or more types of gases among such gases as Ar, Ne, $N_2$, and $O_2$.

In addition, it is to be noted that various types of plasma processing, as well as the sputtering process, are applicable.

In the case of using the ion milling technique, the process of forming surface roughness was performed under the conditions that, a degree of vacuum was set at $3\times10^{-6}$ Torr, with an ion current density of 0.5 mA/cm$^2$, and an acceleration voltage of 600 eV. The magnetic head was fixedly secured to a mounting jig, and the jig holder was cooled by water.

The resultant surface roughness was defined as a maximum surface roughness as shown in FIGS. 6A and 6B.

In FIGS. 6A and 6B, the head sliding surface comprises a core body portion 60 of a magnetosensitive substance and non-magnetosensitive portion 61 having projections 62 formed thereon. The magnetosensitive portion 60 corresponds to the core body 23, and the non-magnetosensitive portion 61 corresponds to the substrate 26 and cover member 25 shown in FIGS. 5A and 5B. The maximum surface roughness was given by a maximum value R of projection height, i.e., surface irregularities, while surface defects such as surface depressions and abnormal projections were excluded from the maximum value. The maximum surface roughness was measured with an atomic force microscope (AFM). The size of each projection 62 approximately corresponds to the crystalline particle size of the core body for surface irregularities.

The degree of maximum surface roughness depends on sputtering time as well as ion milling time. It was further found that the degree of the maximum surface roughness depends also on the materials of the substrate and cover member.

Figure 7:
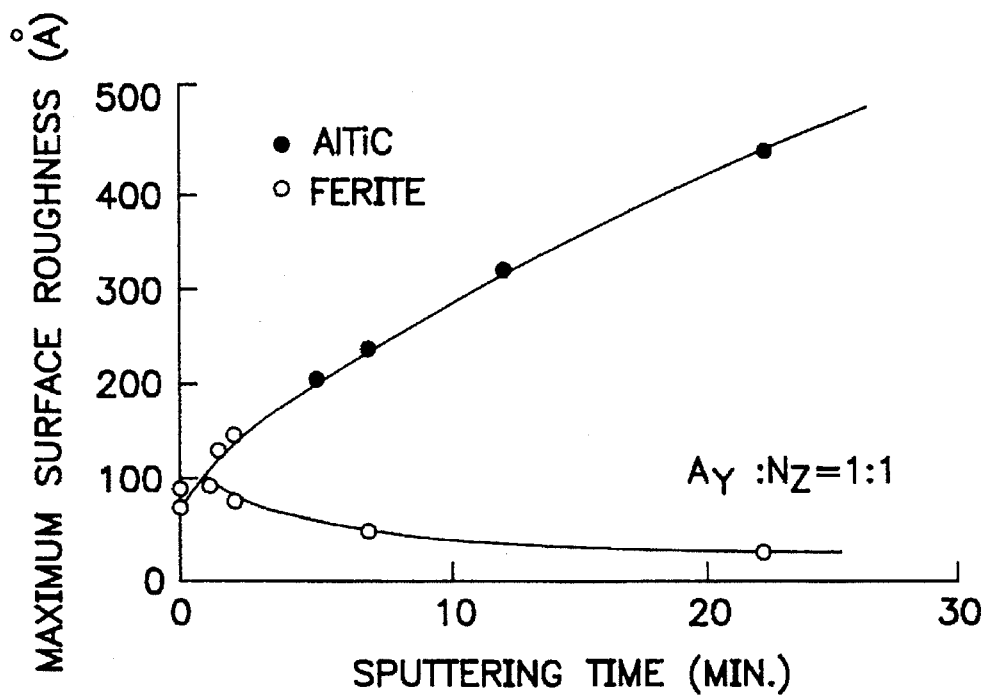
FIG. 7 is a graph showing variation in maximum surface roughness with sputtering time varied.

In FIG. 7, there is shown variation in the maximum surface roughness with sputtering time varied. A comparison in maximum surface roughness was made between the use of AlTiC, which is a sintered body of $Al_2O_3$ and TiC, and the use of ferrite as the material of the substrate and the cover member, except for the magnetosensitive portion 60. From the figure, it is shown that the maximum surface roughness increases with time in the case of using AlTiC material, reaching 450 Å as a maximum surface roughness obtained over a sputtering time of 22 minutes.

The maximum surface roughness decreases in the case of using the ferrite material. In addition, the surface roughness of the magnetosensitive portions did almost not change at all. AlTiC is a compound material of $Al_2O_3$ and TiC, and their sputtering yield differs from each other, where $Al_2O_3$ is smaller in sputtering yield than TiC by one order or more. This could be considered as the reason that TiC is preferentially sputtered and, as a result, irregularities are developed on the surface. An average grain size of AlTiC of, for example, 1.5 μm, 0.8 μm, 1.0 μm and the like are available.

In contrast, it is considered that in the case of ferrite, the sputtering yield is substantially equal in the structures, and therefore surface irregularities will not take place. As a result, in the present invention, the material of the substrate and cover member is not limited only to AlTiC, but may be any material composed of two or more types of materials having different sputtering yields in combination.

The head sliding surface having the above-mentioned surface roughness formed thereon was thereafter coated with nitrided chrome, and the evaluation for wear resistance was carried out. It is noted that the maximum surface roughness after coating the nitrided chrome on the sliding surface remains substantially unchanged as it is before coating. The film thickness of the nitrided chrome was made constant at 500 Å. As mechanical characteristics of nitrided chrome, the compressive internal stress was $2 \times 10^{10}$ $dyn/cm^2$ and the Knoop hardness was 2300 $kgf/mm^2$. The evaluation of wear resistance was performed at a pad pressure of 20 g with each magnetic head incorporated into the cassette deck mechanism, and with the use of a magnetic tape made of chrome oxide. For the head used in the evaluation of wear resistance, AlTiC and ferrite were used as both core material and cover material in each case. A tape running test was performed for 1500 hours under a normal temperature, normal humidity environment while the magnetic tape was replaced with a new one every 100 hours. The evaluation was made by observing the sliding surface with an optical microscope after tape sliding, where the peel-off state of the nitrided chrome was evaluated.

Table 3 shows results of the running test of the embodiment of the present invention.

Examples 11 to 14 in Table 3 are examples of the evaluation of wear resistance when the maximum surface roughness on the substrate and cover of the head sliding surface was made to be 150Å or more, with the sputtering time varied. The sputter gas was a mixed gas of Ar and $N_2$, where Ar: $N_2$=1:1. In all the cases, excellent results were obtained. The peel-off wear of the sliding surface after running tape for 1500 hours was 20% or less with respect to a magnetic tape using chrome oxide, having a strong paring force. It can also be understood that the larger the surface roughness, the smaller the peel-off wear area and the better the wear resistance.

Further, Example 15 is an example in which only Ar was used and Examples 16 and 17 are those in which a mixed gas of Ar and $O_2$ was used, where the mixed gas ratio was Ar: $O_2$=2:1. In these examples also, it is found, excellent wear resistances were obtained as in Examples 11 to 14, irrespective of the type of the gas.

Meanwhile, as shown in Reference Examples 10 and 11, when the maximum surface roughness was less than 150Å, significant peel-off wear took place. Also, as shown in Reference Example 12, where a mixed gas of Ar and $O_2$ was used, and in Reference Examples 13 and 14 where ferrite was used for the substrate and cover material, when the maximum surface roughness was small, significant peel-off wear took place.

Figure 8:
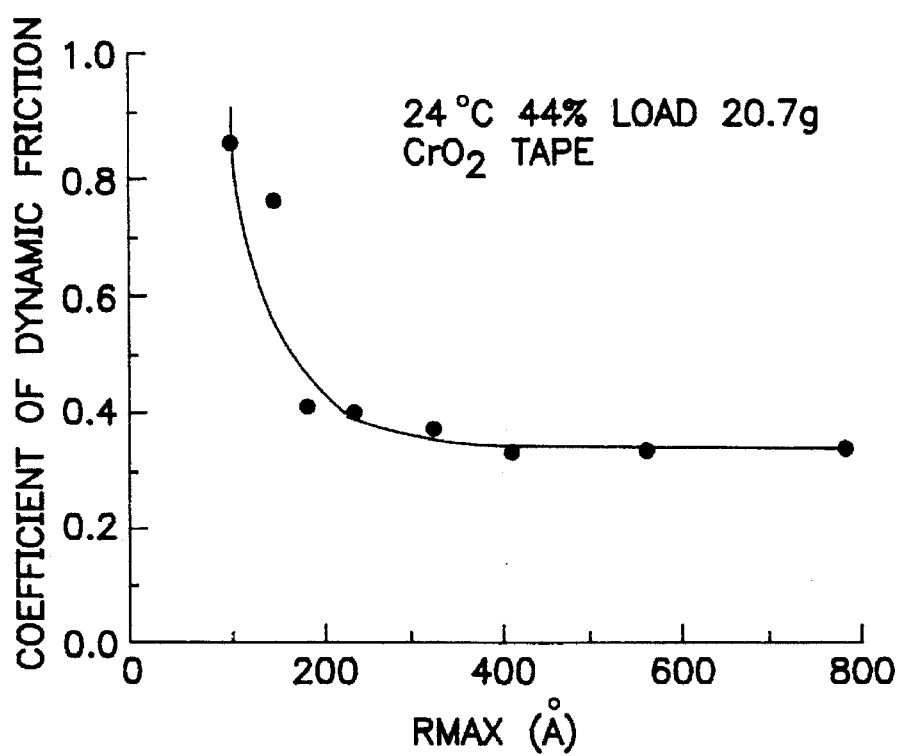
FIG. 8 is a graph showing a relationship between coefficient of dynamic friction and maximum surface roughness.

FIG. 8 shows a relationship between the coefficient of dynamic friction and the maximum surface roughness. The measurement of the coefficient of dynamic friction in this case was performed by using a friction meter made by Kyowa Kagaku K.K. (Model DF-PF) and under measuring conditions of 24° C., 44% RH, and a 20.7 g load, with the use of chrome oxide tape. From the figure, as the maximum surface roughness increases, the coefficient of dynamic friction abruptly decreases, down to 0.5 or less with the surface roughness over 150Å. Accordingly, it can be understood that giving surface roughness to the head sliding surface in addition to the excellent wear resistance of nitrided chrome results in a decreased coefficient of dynamic friction, with the wear resistance further improved. As described above, wear resistance depends also on the maximum surface roughness, so that the maximum surface roughness needs to be 150Å or more in order to obtain excellent wear resistance.

Meanwhile, when the maximum surface roughness of the non-magnetosensitive portions 61 becomes larger than 1000Å, the strength of the projections 62 becomes weak, so that the wear resistance deteriorates. When the maximum surface roughness becomes larger than 500Å, gaps between the substrate or cover member and the magnetosensitive portion 60 become larger, and the gaps serve as spacings which could adversely affect the electromagnetic conversion characteristic. Therefore, the maximum surface roughness is desirably set within the range of 150 to 500Å.

Table 4 shows results of the tape running test, which is an embodiment of the present invention where ion milling is applied. Examples 17 and 18 in Table 4 are examples of the evaluation of wear resistance where the maximum surface roughness on the substrate and cover of the head sliding surface was made to be 150Å or more, with the ion milling time varied. It is noted that the ions used in those cases were positive Ar ions only. This method also proved to provide more than 150Å surface roughnesses, showing excellent wear resistance.

Meanwhile, Reference Examples 15 and 16 show cases where the maximum surface roughness is smaller than 150Å with AlTiC used as the material of the substrate and cover member, and Reference Examples 17 and 18 show cases where surface roughness could not be obtained with ferrite used as the substrate material. In any of the cases, peel-off wear took place to a great extent. In the ion milling process also, surface roughness can be obtained by ion radiation like in the sputtering process, where excellent wear resistance can be obtained with 150Å or more maximum surface roughnesses. Further, similar effects could be obtained with use of not only Ar ions but also one type or a combination of two or more types of ions from among Ne, $N_2$, and $O_2$.

TABLE 1

|  | Bias voltage (V) | Sputter gas pressure m Torr | Internal stress × $10^{10}$ dyn/cm$^2$ | Knoop hardness kgf/mm$^2$ | Surface condition after 1000 hr. sliding |
| --- | --- | --- | --- | --- | --- |
| Example 1 | 0 | 8.0 | 0.6 | 1510 | Peel-off wear, 10% or less |
| Example 2 | −30 | 8.0 | 2.0 | 2100 | Peel-off wear, none |
| Example 3 | −50 | 8.0 | 7.5 | 2330 | Peel-off wear, none |
| Example 4 | −50 | 4.0 | 12.6 | 2610 | Peel-off wear, 1% or less |
| Example 5 | −75 | 4.0 | 32.5 | 2800 | Peel-off wear, none |
| Example 6 | 0 | 4.0 | 4.0 | 1750 | Peel-off wear, 5% or less |
| Ref. Ex. 1 | 0 | 15.0 | 0.08 | 1400 | Peel-off wear, 60% or more |
| Ref. Ex. 2 | 0 | 20.0 | 0.007 | 1010 | Peel-off wear, 100% |
| Ref. Ex. 3 | −30 | 20.0 | 0.07 | 1200 | Peel-off wear, 80% |
| Ref. Ex. 4 | −100 | 8.0 | 105.0 | 1600 | Cracks & peel-off |
| Ref. Ex. 5 | −100 | 4.0 | — | — | Cracks & peel-off |

TABLE 2

|  | Bias voltage (V) | Nitrogen content atom % | Internal stress × $10^{10}$ dyn/cm$^2$ | Knoop hardness kgf/mm$^2$ | Surface condition after 1000 hr. sliding |
| --- | --- | --- | --- | --- | --- |
| Example 7 | −30 | 20 | 1.8 | 2000 | Peel-off wear, 1% or less |
| Example 8 | −30 | 40 | 2.0 | 2150 | Peel-off wear, none |
| Example 9 | −30 | 50 | 7.5 | 2300 | Peel-off wear, none |
| Example 10 | −30 | 60 | 1.2 | 1730 | Peel-off wear, 10% or less |
| Ref. Ex. 6 | −30 | 10 | 1.1 | 900 | Peel-off wear, 60% or more |
| Ref. Ex. 7 | −30 | 15 | 1.2 | 1010 | Peel-off wear, 100% |
| Ref. Ex. 8 | −30 | 65 | 0.07 | 1200 | Peel-off wear, 80% |
| Ref. Ex. 9 | −30 | 70 | 0.02 | 860 | Peel-off wear, 100% |

TABLE 3

|  | Material of substrate and cover | Type of gas | Max. surface roughness [Å] | Surface condition after 1500 hr. sliding |
| --- | --- | --- | --- | --- |
| Ex. 11 | AlTiC | Ar, N$_2$ | 150 | Peel-off wear, 20% or less |
| Ex. 12 | AlTiC | Ar, N$_2$ | 205 | Peel-off wear, 10% or less |
| Ex. 13 | AlTiC | Ar, N$_2$ | 240 | Peel-off wear, 5% or less |
| Ex. 14 | AlTiC | Ar, N$_2$ | 314 | Peel-off wear, 5% or less |
| Ex. 15 | AlTiC | Ar | 268 | Peel-off wear, 5% or less |
| Ex. 16 | AlTiC | Ar, O$_2$ | 187 | Peel-off wear, 15% or less |
| Ex. 17 | AlTiC | Ar, O$_2$ | 241 | Peel-off wear, 10% or less |
| Ref. Ex. 10 | AlTiC | Ar, N$_2$ | 138 | Peel-off wear, 40% |
| Ref. Ex. 11 | AlTiC | Ar, N$_2$ | 105 | Peel-off wear, 50% |
| Ref. Ex. 12 | AlTiC | Ar, O$_2$ | 82 | Peel-off wear, 50% |
| Ref. Ex. 13 | Ferrite | Ar, N$_2$ | 97 | Peel-off wear, 60% |
| Ref. Ex. 14 | Ferrite | Ar, N$_2$ | 52 | Peel-off wear, 60% |

TABLE 4

|  | Material of substrate and cover | Max. surface roughness [Å] | Surface condition after 1500 hr. sliding |
| --- | --- | --- | --- |
| Example 18 | AlTiC | 163 | Peel-off wear, 15% or less |
| Example 19 | AlTiC | 243 | Peel-off wear, 5% or less |
| Ref. Ex. 15 | AlTiC | 131 | Peel-off wear, 40% |
| Ref. Ex. 16 | AlTiC | 93 | Peel-off wear, 50% |
| Ref. Ex. 17 | Ferrite | 102 | Peel-off wear, 50% |
| Ref. Ex. 18 | Ferrite | 68 | Peel-off wear, 60% |

What is claimed is:

1. A magnetic head, comprising:
   a non-magnetosensitive portion including a substrate and a cover member, said non-magnetosensitive portion having a top surface;
   a magnetosensitive portion including a core body between said substrate and said cover member, said magnetosensitive portion having a top surface; and
   a protective thin film covering said top surface of at least one of said non-magnetosensitive portion and said magnetosensitive portion;
   wherein said magnetosensitive portion comprises a plurality of minute projections forming surface irregularities on said top surface thereof, said plurality of minute projections having a maximum surface roughness, defined as a maximum value of the heights of said plurality of minute projections on said top surface, that is in a range from 150 angstroms to 314 angstroms;

wherein said core body of said magnetosensitive portion comprises said top surface of said magnetosensitive portion and has said plurality of minute projections that having a size approximately corresponding to a crystalline particle size of said core body.

2. A magnetic head, comprising:

a non-magnetosensitive portion including a substrate and a cover member, said non-magnetosensitive portion having a top surface;

a magnetosensitive portion including a core body between said substrate and said cover member, said magnetosensitive portion having a top surface; and a protective thin film covering said top surface of at least one of said non-magnetosensitive portion and said magnetosensitive portion;

wherein said non-magnetosensitive portion comprises a plurality of minute projections forming surface irregularities on said top surface thereof, said plurality of minute projections having a maximum surface roughness, defined as a maximum value of the heights of said plurality of minute projections on said top surface, that is in a range from 150 angstroms to 314 angstroms;

wherein said non-magnetosensitive portion comprises said plurality of minute projections forming surface irregularities on said top surface thereof that have a size approximately corresponding to a crystalline particle size of said non-magnetosensitive portion.

3. The magnetic head of claim 1, wherein said protective thin film comprises a chromium nitride substance.

4. The magnetic head of claim 3, wherein said protective thin film has a thickness not greater than 1000 Angstroms.

5. The magnetic head of claim 2, wherein said non-magnetosensitive portion comprises a material composed of a combination of at least two different materials having different sputtering yields.

6. The magnetic head of claim 5, wherein said non-magnetosensitive portion comprises $Al_2O_3$ and TiC.

7. The magnetic head of claim 2, wherein said non-magnetosensitive portion comprises $Al_2O_3$ and TiC.

8. A magnetic head, comprising:

a non-magnetosensitive portion including a substrate and a cover member, said non-magnetosensitive portion having a top surface;

a magnetosensitive portion including a core body between said substrate and said cover member, said magnetosensitive portion having a top surface; and a protective thin film covering said top surface of at least one of said non-magnetosensitive portion and said magnetosensitive portion;

wherein said at least one of said non-magnetosensitive portion and said magnetosensitive portion comprises a plurality of minute projections forming surface irregularities on said top surface thereof;

wherein said plurality of minutes projections of said at least one of said non-magnetosensitive portion and said magnetosensitive portion have a size approximately corresponding to a crystalline particle size of said at least one of said non-magnetosensitive portion and said magnetosensitive portion; and wherein said thin film comprises CrN no greater than 0.1 μm in thickness.

* * * * *